United States Patent
Tsironis

(10) Patent No.: US 9,666,928 B1
(45) Date of Patent: May 30, 2017

(54) HIGH POWER SLIDE SCREW TUNERS

(71) Applicant: Christos Tsironis, Kirkland (CA)

(72) Inventor: Christos Tsironis, Kirkland (CA)

( * ) Notice: Subject to any disclaimer, the term of this patent is extended or adjusted under 35 U.S.C. 154(b) by 26 days.

(21) Appl. No.: 14/928,092

(22) Filed: Oct. 30, 2015

(51) Int. Cl.
| | |
|---|---|
| *H03H 7/38* | (2006.01) |
| *H01P 5/04* | (2006.01) |
| *G01R 27/32* | (2006.01) |
| *H03H 7/40* | (2006.01) |

(52) U.S. Cl.
CPC ............. *H01P 5/04* (2013.01); *G01R 27/32* (2013.01); *H03H 7/40* (2013.01)

(58) Field of Classification Search
CPC .................................. H03H 7/38; H03H 7/40
USPC .............................................. 333/263, 32, 33
See application file for complete search history.

(56) References Cited

U.S. PATENT DOCUMENTS

| | | | | |
|---|---|---|---|---|
| 4,303,899 A | * | 12/1981 | Barley ...................... | H01P 7/04 333/225 |
| 6,674,293 B1 | | 1/2004 | Tsironis | |
| 8,143,975 B2 | * | 3/2012 | Perndl ..................... | H01P 5/085 333/260 |
| 8,466,758 B1 | * | 6/2013 | Tsironis ................... | H01P 5/04 333/17.3 |
| 8,975,988 B1 | * | 3/2015 | Tsironis ................... | H01P 5/04 333/17.3 |

* cited by examiner

*Primary Examiner* — Stephen E Jones

(57) ABSTRACT

Impedance tuners used in high power measurements suffer fast heating and consequently thermal expansion of the center conductor, which has a very small mass and is thermally isolated from the environment and tuner housing. This leads to false measurements or catastrophic tuner failure (short) of either the DUT or the tuner. Modified center conductors are made of two pieces and comprise a flexible joint between them that allows longitudinal center conductor expansion and contraction, thus preserving tuner accuracy and safety. Practical tests have shown significant improvement in thermal behavior.

9 Claims, 17 Drawing Sheets

HIGH POWER SLIDE SCREW TUNERS

PRIORITY CLAIM

Not Applicable

CROSS-REFERENCE TO RELATED ARTICLES

1. Load Pull System: http://www.microwaves101.com/encyclopedia/loadpull.cfm
2. "Computer Controlled Microwave Tuner—CCMT", Product Note 41, Focus Microwaves, January 1998
3. Standing wave ratio, VSWR: https://en.wikipedia.org/wiki/Standing_wave_ratio
4. Tsironis, U.S. Pat. No. 6,674,293, "Adaptable pre-matched tuner system and method"
5. Time Domain Reflectometry: https://en.wikipedia.org/wiki/Time-domain_reflectometer
6. Buckling: https://en.wikipedia.org/wiki/Buckling

BACKGROUND OF THE INVENTION

This invention relates to RF load and source pull testing of medium and high power RF transistors and amplifiers using remotely controlled electro-mechanical impedance slide screw tuners. Modern design of high power RF amplifiers and mixers, used in various communication systems, requires accurate knowledge of the active device's (microwave transistor's) characteristics. In such circuits, it is insufficient for the transistors, which operate in their highly non-linear regime, close to power saturation, to be described using non-linear numeric models only.

A popular method for testing and characterizing such microwave components (transistors) in the non-linear region of operation is "load pull" (FIG. 1). Load pull is a measurement technique employing microwave impedance tuners (2,4) and other microwave test equipment, such as signal sources (1), test fixtures and DUT (3) and power meters (5), the whole controlled by a computer (6); the computer controlling and communicating with the tuners (2,3) and other equipment (1,3,5) uses digital cables (7,8,9). The tuners are used in order to manipulate the microwave impedance conditions under which the Device Under Test (DUT, or transistor) is tested (see ref. 1); tuners allow determining the optimum impedance conditions for designing amplifiers and other microwave components for specific performance targets, such as gain, efficiency, intermodulation etc.; this document refers hence to "tuners" as being "impedance tuners", in order to distinct from "tuned receivers (radios)", popularly called elsewhere also "tuners" because of the included tuning circuits (see ref. 2).

Impedance tuners consist, in general, of a transmission line (23, 24) and adjustable probes (22), FIG. 2; said probe (22) is attached to a precision vertical axis (21) which is mounted in a mobile carriage (28); said axis (21) can move the probe (22) vertically (216) towards the center conductor (23) and the carriage (28) can move the probe (22) horizontally 217) parallel to said center conductor (23). The vertical movement (216) changes the amplitude of the reflection factor seen at the tuner test port (25) whereas the horizontal movement (217) changes the phase. This way the whole Smith chart is covered allowing quasi-infinity of impedances from Zmin to Zmax to be synthesized at any given frequency within the "tuning range" of said tuner. Typical values of state of the art tuners are |Zmin|=2 Ohm and |Zmax|=1250 Ohm; this corresponds to Voltage Standing Wave Ratio (VSWR) of 25 (FIG. 7). The relation between reflection factor and impedance is given by GAMMA=|GAMMA|*exp(j$\Phi$)=(Z-Zo)/(Z+Zo) {eq. 1}, wherein Z is the complex impedance Z=R+jX and Zo is the characteristic impedance. A typical value used for Zo is Zo=50 Ohm [3]. The equivalent is the Voltage Standing Wave Ratio: VSWR=(1+|GAMMA|)/(1-|GAMMA|) {eq. 2}, see ref. 3.

Metallic probes (22) or slugs are made in a cubical form (41) with a concave bottom (35) which allows to capture, when approaching the center conductor (32) (see ref. 4 and FIG. 11) the electric field which is concentrated in the area (36) between the center conductor (32) and the ground planes of the slabline (31) (FIG. 3). This "field capturing" allows creating high and controllable reflection factors. The critical part is the required proximity and accuracy of both the vertical and horizontal probe movement (FIG. 7), whereby changes in the vertical probe position (72) of a few micrometers affects the VSWR by a large amount.

When microwave power is injected into the tuner some of it is absorbed by the center conductor of the slabline (66). This leads to a rise of its temperature and associated longitudinal expansion (615, 616 in FIG. 6(*a*)). Since the center conductor (66) is fixed at both ends on the coaxial connectors it has only limited range for expansion; this will lead to "bending" (67) in FIG. 6(*a*); "Bending" happens in different ways, depending on the pre-disposition of the center conductor, which cannot be "perfectly" straight (FIGS. 6(*b*2) and 6(*b*3)). Whereas in an ideal situation (FIG. 6(*b*1)) the center conductor is positioned exactly in the center of the slabline channel, when the center conductor is heated and buckles (see ref. 6) it may either deflect sidewise (617) or downwards (614); of course it may also deflect upwards (not shown), in which case we may have a short circuit same as when it deflects sidewise (617). In either case the effect is at best loss of accuracy or at worst an electrical short and damage of the tuner and/or the DUT.

In case an electrical short occurs followed by either temporary or permanent damage of the tuner or the DUT, at least the operator will be alerted and can take measures to correct the situation, as shown later on in this disclosure. But if it does not come to a short (case FIG. 6(*b*3)), then the effect will be false measurement and spurious resonances (53) in the otherwise typically flat (52) response of the reflection factor (S11), which is created when the tuning probe is close to the center conductor as shown in FIG. 6(*b*1). This is because, as shown in FIG. 7, in the area (72) a relatively small movement between the tuner probe (615) and center conductor (611) in FIG. 6, will change the calibrated VSWR substantially; in other words the data retrieved from the measurement instruments (FIG. 1) will be associated and recorded at the wrong VSWR values. There will be no warning, just wrong data; it comes even worse: should the operator not trust the measured data and develop doubts about the tuner accuracy, and should he disconnect the tuner from the test setup in order to re-calibrate or verify the calibration on a VNA (see FIG. 8), he, probably, will find that the tuner is accurate. This is because, during the dismantling of the setup the center conductor will cool down and recover its initial (calibrated) position (transition from states in FIGS. 6(*b*2), 6(*b*3) back to the state of FIG. 6(*b*1); this can be a very critical systemic problem for high power testing using such tuners. This invention discloses embodiments of a technique allowing the avoidance of such systemic test problems.

BRIEF DESCRIPTION OF THE SEVERAL VIEWS OF THE DRAWINGS

The invention and its mode of operation will be more clearly understood from the following detailed description when read with the appended drawings in which:

FIG. 6 a) the center conductor deformation ("buckling", see ref. 6) due to heating and limited expansion possibility and FIG. 6 b) the associated possible positions of the center conductor related to the tuning probe.

FIG. 9 a) a first embodiment of center conductor modification allowing thermal expansion of center conductor in tuners (sliding contact) and FIG. 9 b) associated local inductive reflection in time domain reflectometry (TDR, see ref. 5).

DETAILED DESCRIPTION OF THE INVENTION

Figure 9:
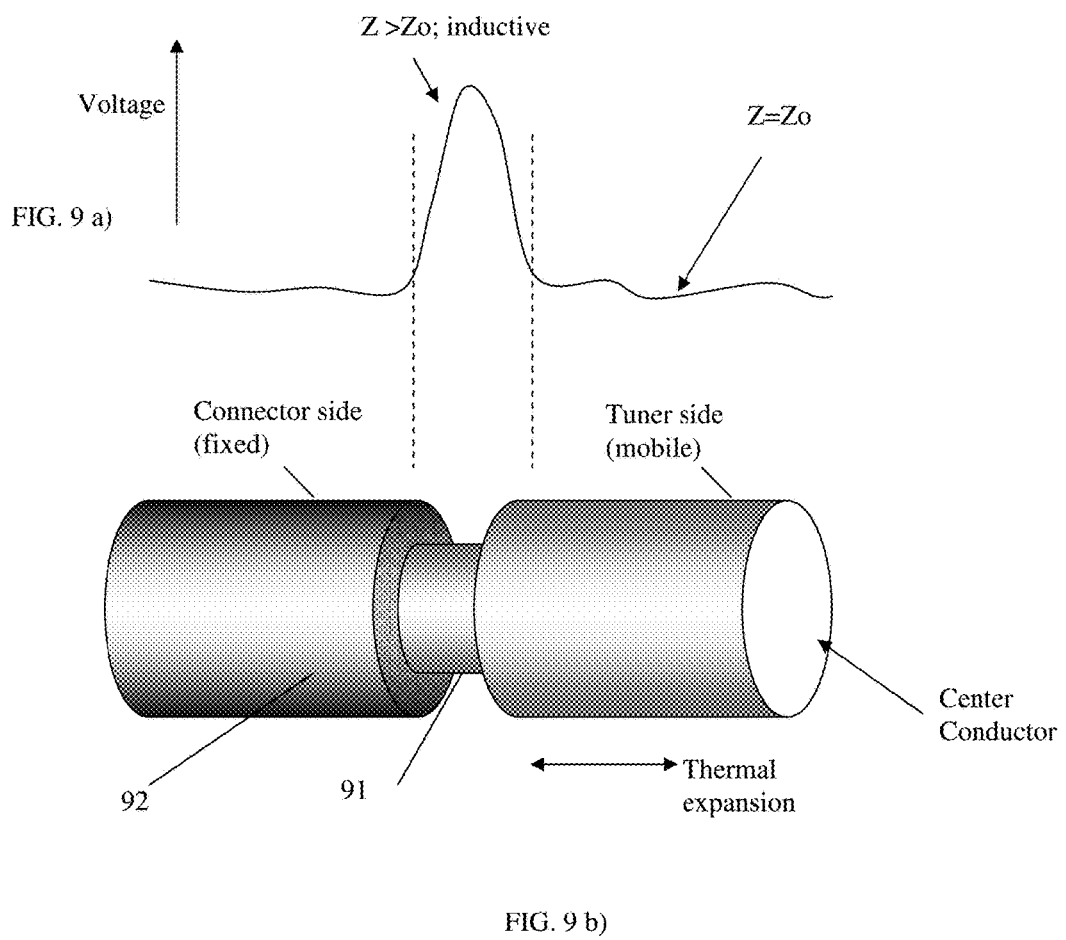
FIGS. 9 a) and 9 b) depict.

This invention discloses simple and easily employable techniques destined to improve on the customary weaknesses of sliding contacts to yield a reliable configuration as shown in FIG. 9 b) and allow pre-calibrated automated slide screw impedance tuners to operate without risking destructive behaviour and/or systemic measurement errors, which come from the fact that the center conductor rods in such tuners have typical slenderness factors λ (see ref. 6) above 100, i.e. the length over diameter exceeds a ratio of 100, especially in the case of multi-carriage tuners, where several half wavelengths at the lowest frequency of operation are comprised in the tuner; the main reason for such behaviour is heating of the center conductor; this happens because the dissipated RF and DC power in the tuner (in fact it dissipates mostly on the center conductor) causes the thin center conductor, which is thermally isolated from the tuner housing, to expand linearly in axial direction and, if the structure of the slabline and the tuner housing and the anchoring of the center conductor on the coaxial connectors at the two tuner ports, do not tolerate this expansion, the center conductor will move out of its axis and ultimately "buckle" (see ref. 6).

A configuration allowing thermal expansion and contraction of the center conductor in slide screw tuners involves various embodiments of sliding contacts (FIGS. 9 to 15). Sliding contacts can be unreliable and bear the risk of being worn out after a certain period of heating/cooling cycles. Also, in the area where one center conductor (92) enters the other, the jump in center conductor diameter (91) causes a spurious impedance jump. In this particular case the spurious impedance jump is inductive, since the portion of sliding contact (91) represents an inductance and has a higher characteristic impedance (Z>Zo) than the slabline itself; this is shown in FIG. 9 a) and can be measured using time domain reflectometry (TDR), see ref. 5, a technique that can use a network analyzer to measure the frequency response and inverse Fourier transformation to convert from the measured frequency domain reflection factor response of the slabline to time domain response and display impedance behaviour as a function of location along the length of the slabline. It is therefore important to reduce this gap (91) and associated impedance jump as much as possible, especially at high frequencies, where the gap may be of the order of magnitude of the wavelength.

Figure 10:
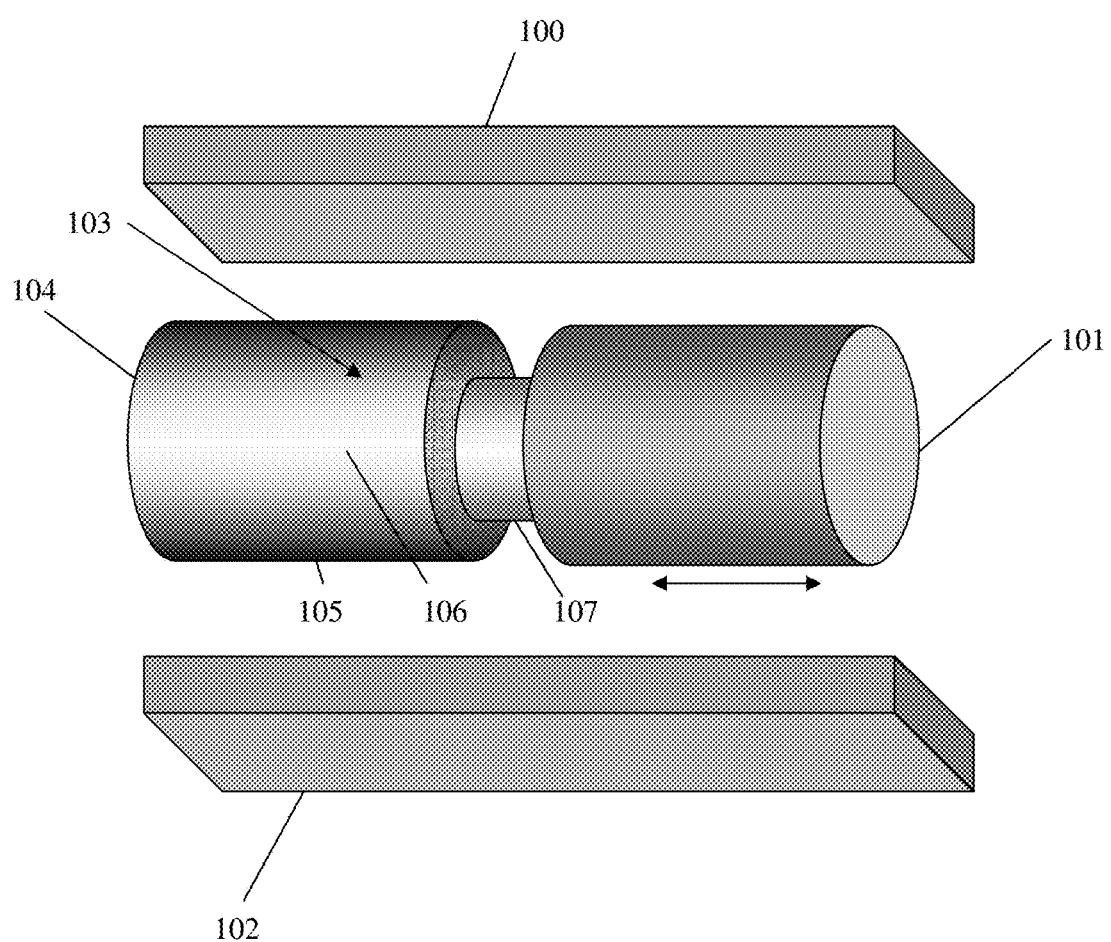
FIG. 10 depicts implementation of the embodiment of FIG. 9(a), the extended pin of the mobile section of the center conductor being slotted and expanded to ensure reliable sliding contact with the inner wall of the hole in the fixed section.
Figure 11:
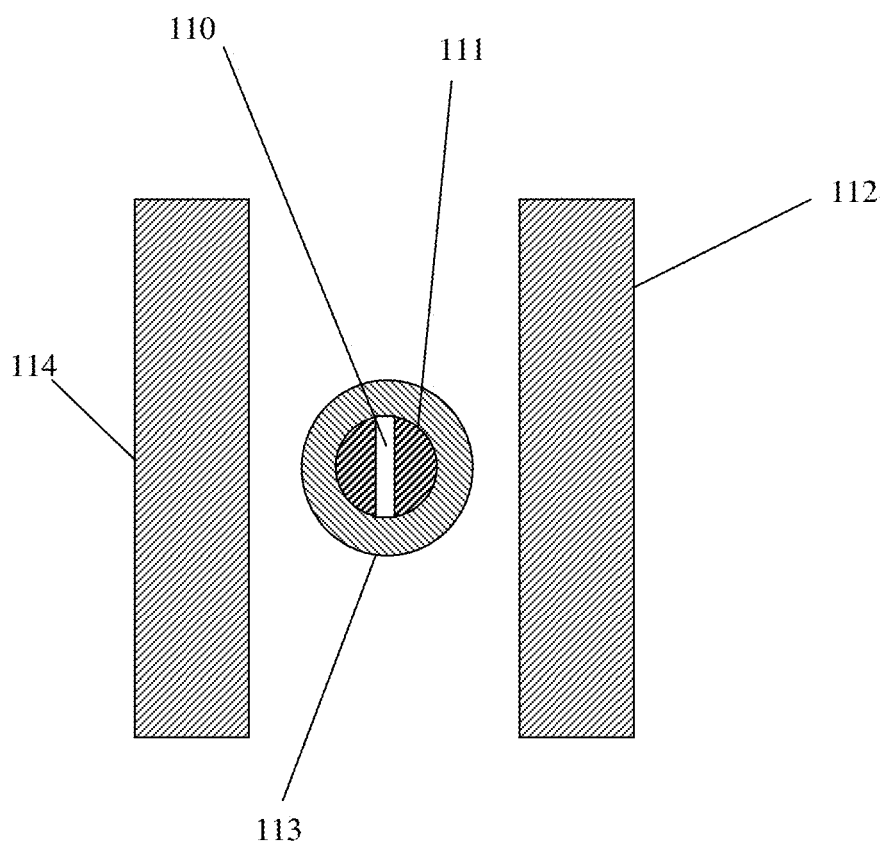
FIG. 11 depicts a cross section of the embodiment of FIG. 10.

In a first embodiment the reliability of the sliding contact is ensured by cutting a vertical slot (106) into the protruding section (107) of the mobile part (101) of the center conductor (FIG. 10). The hole (105) in the fixed part (104) of the center conductor extends beyond the reach of the protruding section (107) to allow for the expected expansion of the mobile section (101). The slot (106) establishes a spring effect against the inner surface of the hole (103) thus guaranteeing a continuous and reliable electrical contact. The slot (106) must be cut vertically (i.e. parallel to the side walls of the slabline) in order to minimize the disturbance of the electric field between center conductor and walls, which is mostly concentrated laterally at the closest distance between center conductor and sidewalls. A cross section of the FIG. 10 embodiment is shown in FIG. 11, showing the orientation of the slot (110), cut into the protrusion (111) of the center conductor (113) parallel to the side walls (112), (114). This embodiment requires a minimum thickness of the center conductor, typically 3 mm or more.

Figure 17:
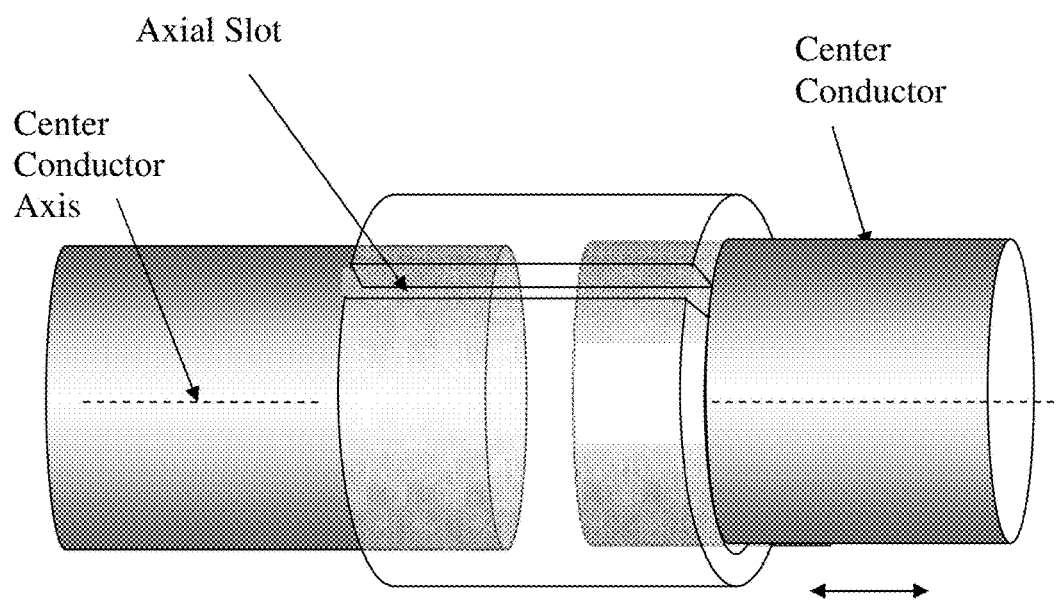
FIG. 17 depicts the typical structure of the axially slotted metallic ring used in the embodiments of FIGS. 10 to 16.

In a second embodiment (FIG. 12) the two parts of the center conductor rod (123) and (124) are joined using a metallic ring (122) placed above and sliding on both parts. To establish reliable electrical contact, a slot (121) is cut into the ring (122) in a way as to be able to open the ring slightly to allow it to slide it over the rods (FIG. 17). To avoid the ring sliding beyond the edge of one of the rods and falling out, a small amount of silicon or glue can be applied on one side to prevent this. However attention is needed for avoiding any insulating substance to creep between the ring and the rod. For the same reasons, as discussed in the embodiment of FIGS. 10 and 11, the slot (121) must be on the top of the ring, where the electric field is minimum, as shown in the cross section of this embodiment in FIG. 13; the slot (131) in the ring (130) is cut axially, parallel to the center conductor (133) and on its top surface. The main advantage of this embodiment is that it requires a minimum in machining work, is relatively tolerant to manufacturing imprecision and, mostly, because it can also be used for thin center conductors, such as 1 mm or less.

Figure 12:
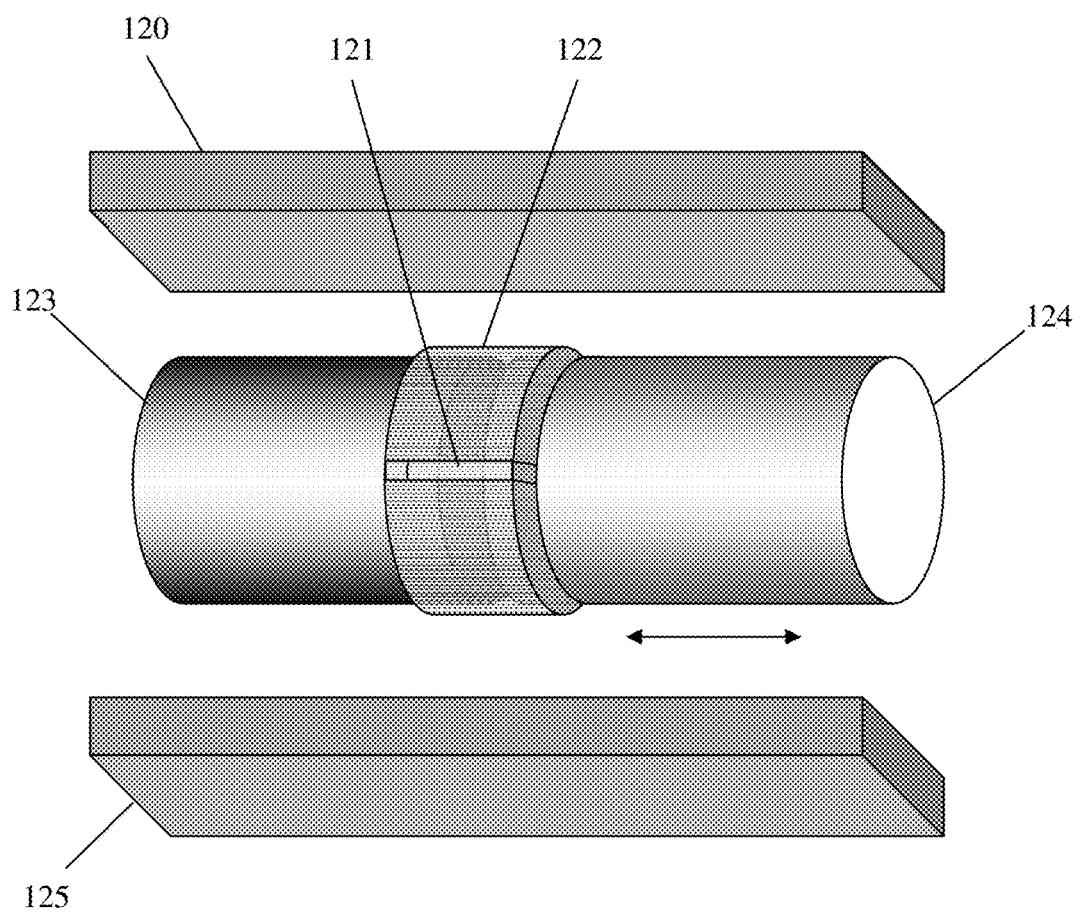
FIG. 12 depicts a second embodiment allowing thermal expansion of the center conductor, using an enveloping ring.
Figure 13:
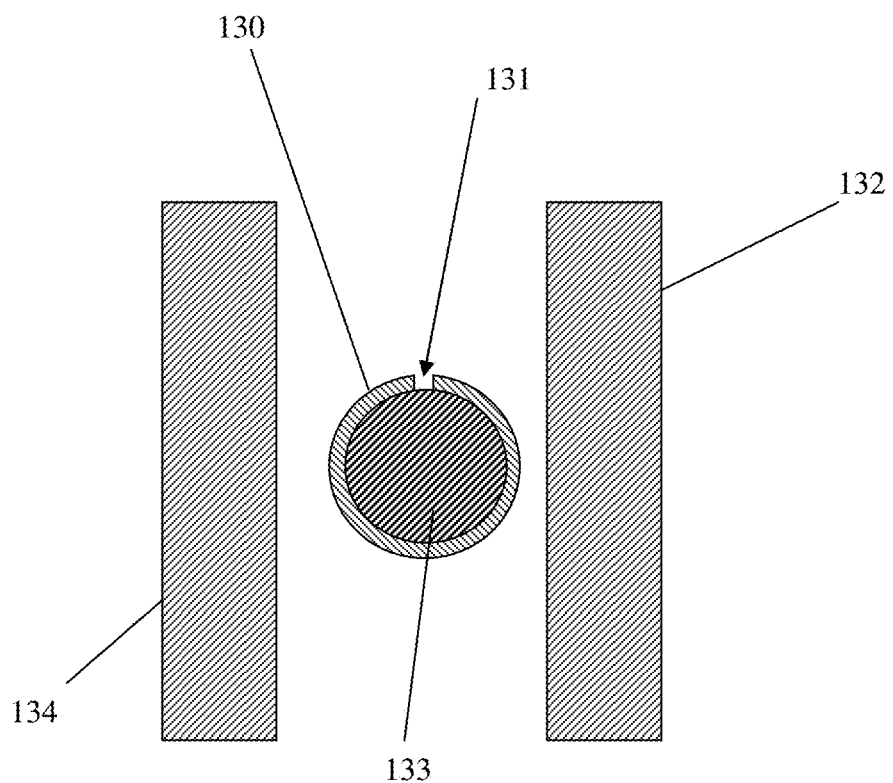
FIG. 13 depicts a cross section of the embodiment of FIG. 12.
Figure 14:
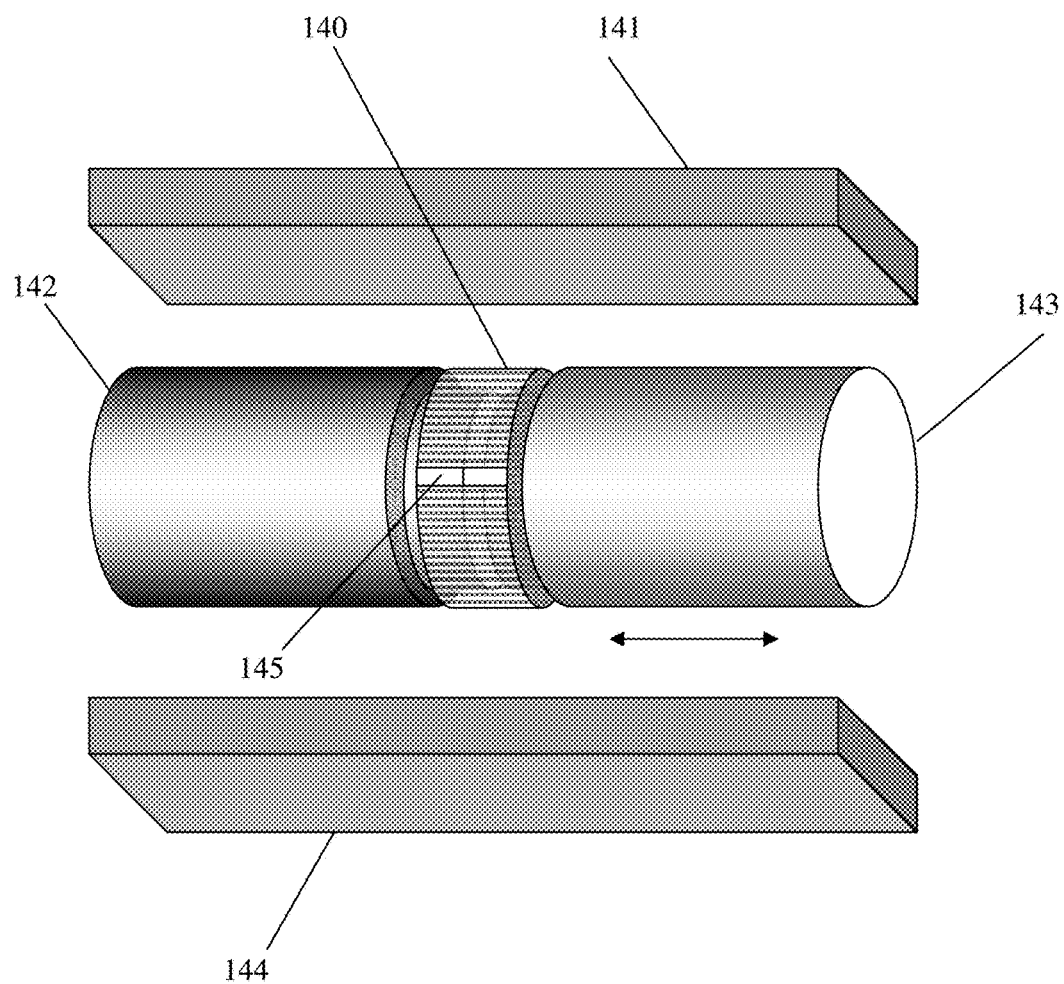
FIG. 14 depicts an alternative embodiment to FIG. 12: the enveloping ring is inserted in recessed section of center conductor to allow sliding while avoiding large reflection.
Figure 15:
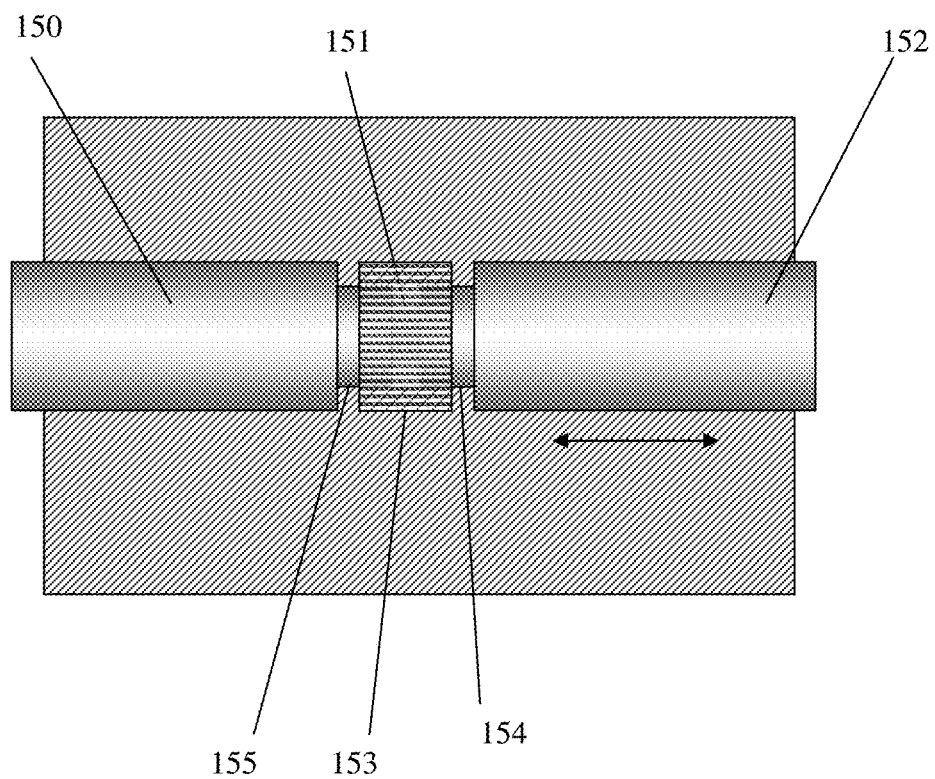
FIG. 15 depicts a side view of the embodiment of FIG. 14.

An alternative embodiment to FIG. 12 is shown in FIGS. 14 and 15; in order to preserve to a maximum the characteristic impedance of the slabline, the ring (122) shall have the same diameter as the center conductor. This can be done if short pieces of center conductor on both sides of the cut (151) are recessed in diameter, creating two opposite protrusions (154) and (155) which are joined using the ring (153); the ring must, obviously have a similar slot (145) as the embodiment of FIG. 12, which must be placed on the top of the center conductor, away from the side walls (141) and (144). In this configuration the perturbation of the electric field is minimal and the continuity of the diameter of the center conductor is maximized. The only limitation of this embodiment is machining accuracy when the center conductors become very thin, i.e. having diameter <1 mm; also the associated thickness of the wall of the ring barrel (130) may become too large to allow for the allowable spring effect around the protrusions (154) and (155). It must be noted that, if the friction between the fixed and the moving rods of the center conductor, in either of the three embodiments, created either by the pin (107) sliding (103) into the hole (105), or by the ring (122) sliding over the rods (123) and (124), or the ring (140) sliding over the protrusions (154) and (155), and depending on the slenderness λ of the rod (see ref. 6), is too high and creates a force F beyond the critical force defined by Euler's equation $F=\pi^2 EI/(KL)^2$ {eq. 3}, (see ref. 6), there is a risk that the center conductor "buckles", when heated, before it can expand longitudinally into the available space provided by the cut (151). This is particularly important since lubrication is not permitted, due to the requirement for electrical contact. However this is a matter of precision manufacturing and practical trials and does not affect the validity of the concept.

Figure 16:
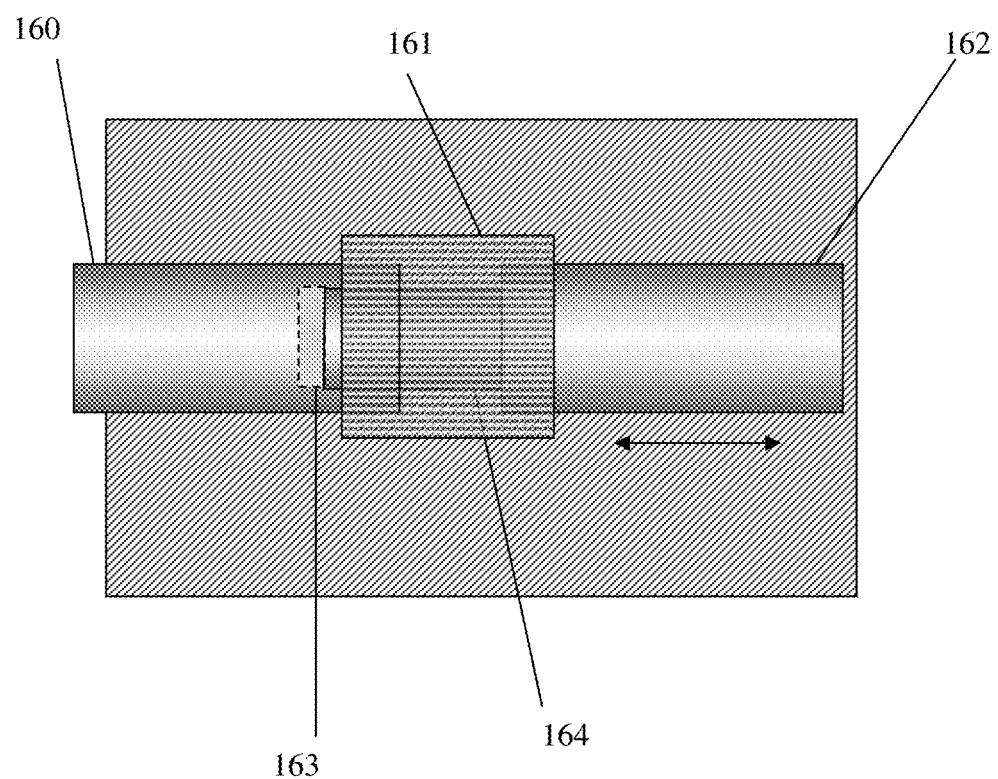
FIG. 16 depicts an embodiment whereby the concentric hole and pin guide the rods and the overlapping ring ensures reliable electrical sliding contact.

FIG. 16 shows an embodiment which combines advantages of two prior embodiments: stability and electrical contact: FIGS. 10 and 12: the concentric hole (163) and pin (164) in the opposite center conductor rods (160) and (162) ensure axial continuity and stability, whereas the overlapping ring (161) adds to the stability and ensures reliable sliding contact. For continuous reliable contact and operation the ring (161) shall also be axially slotted. This embodiment only suffers higher manufacturing complexity, because of the axial hole and pin in FIG. 10. If the diameter of the center conductor is large enough, the embodiment of FIG. 16 can as well be applied as a combination of the embodiments of FIGS. 10 and 14.

In all hereto disclosed embodiments it is obvious that the total length of the two center conductor rods is slightly smaller than the length of the original center conductor length, as is clearly shown in the gaps pointed to between the two rods in FIGS. 10 to 16 (107), (121), (151), (164). The gaps are less than 1 mm and can be calculated using the linear thermal expansion of the rods, which are typically made of gold plated steel: $\Delta L = \alpha \cdot L \cdot \Delta\Theta$ {eq. 4}, whereby α is the linear thermal expansion coefficient of steel $\alpha \approx 15 \cdot 10^{-6}$/K; in a typical example of a 3 mm thick center conductor, used in a tuner and having a length of 300 mm and heated by 50 degrees above room temperature, the gap is $\Delta L = 0.125$ mm.

Figure 1:
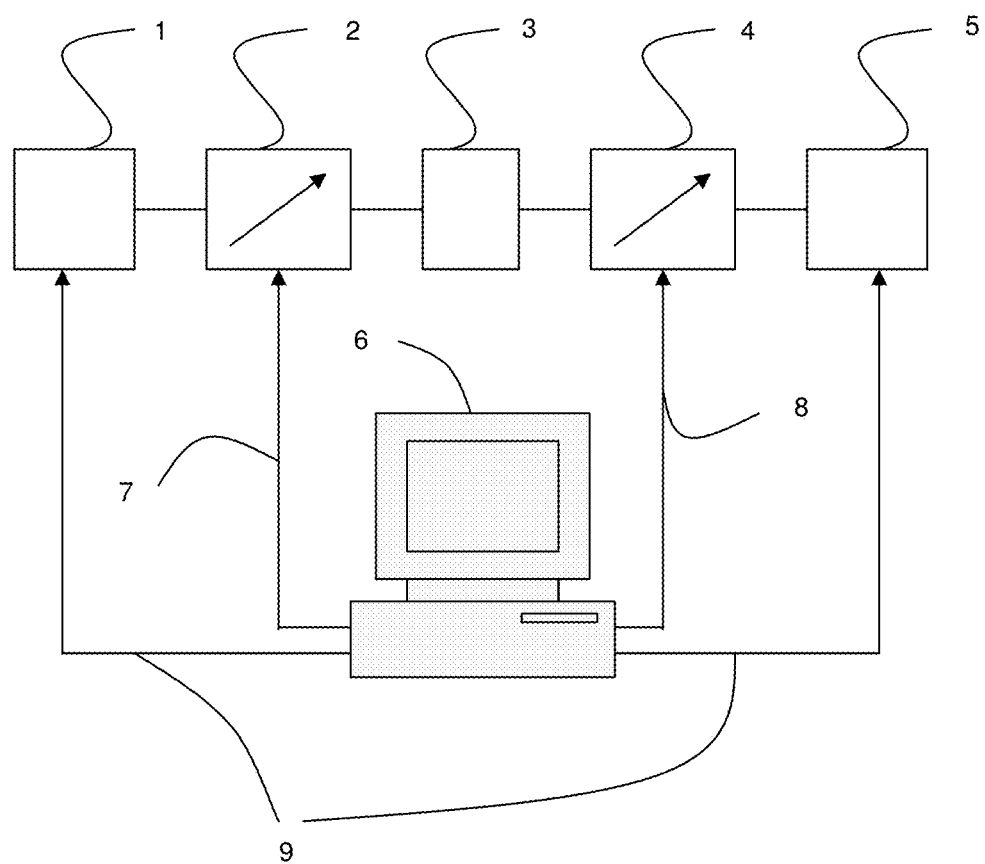
FIG. 1 depicts Prior Art: a typical automated transistor load pull test system.
Figure 2:
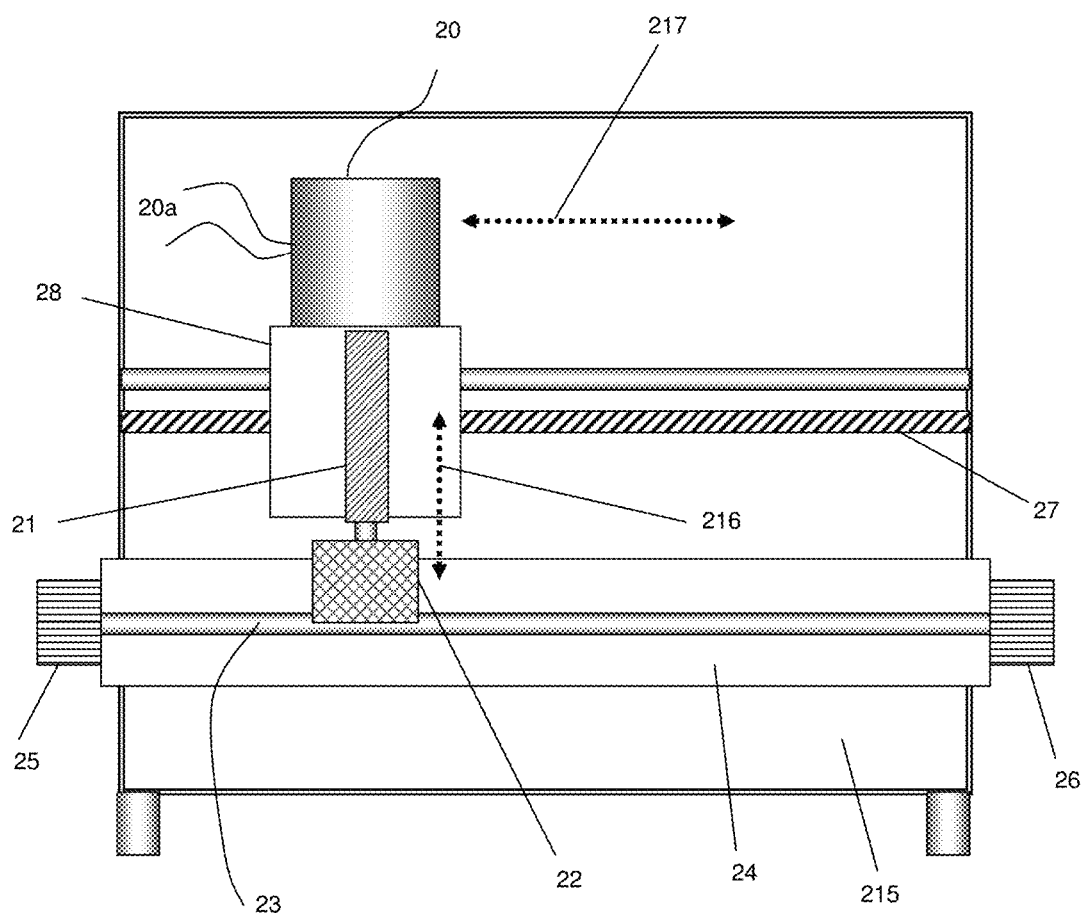
FIG. 2 depicts Prior Art: a front view of an automated slide screw impedance tuner using a single vertical axis and RF probe (slug).
Figure 3:
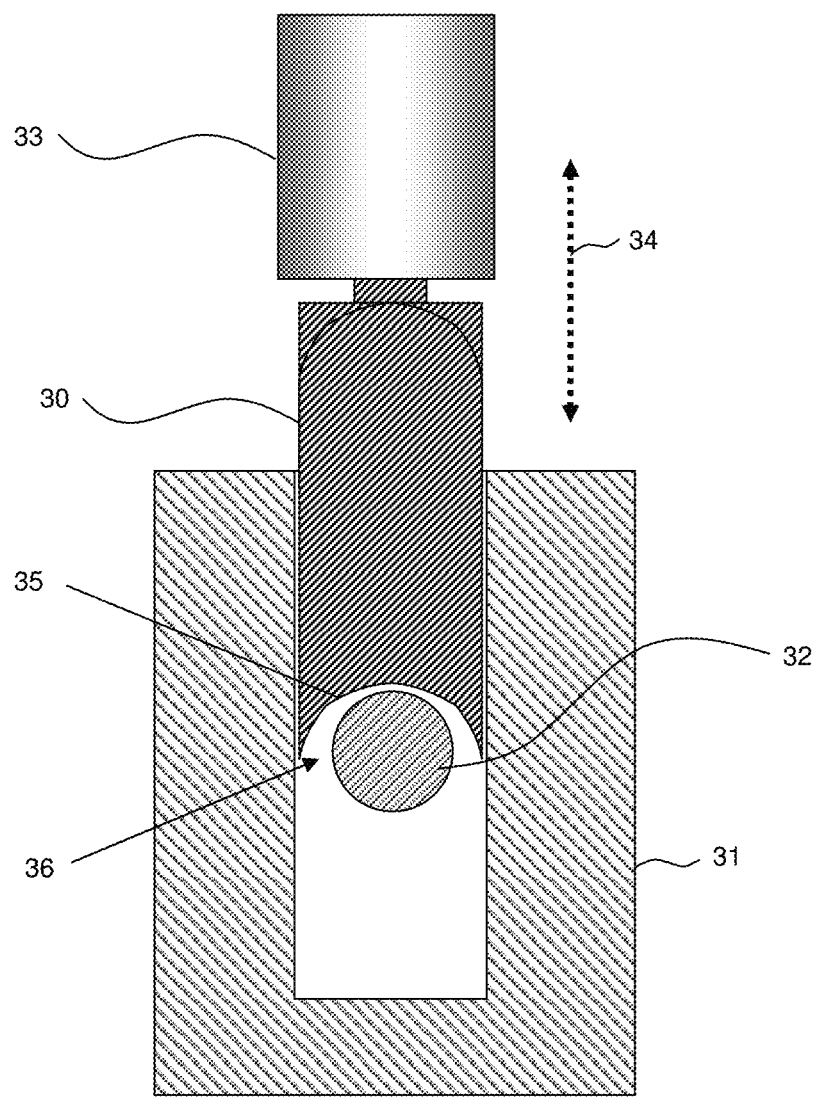
FIG. 3 depicts Prior Art: cross section of RF probe inside a slotted airline (slabline) approaching the center conductor.
Figure 4:
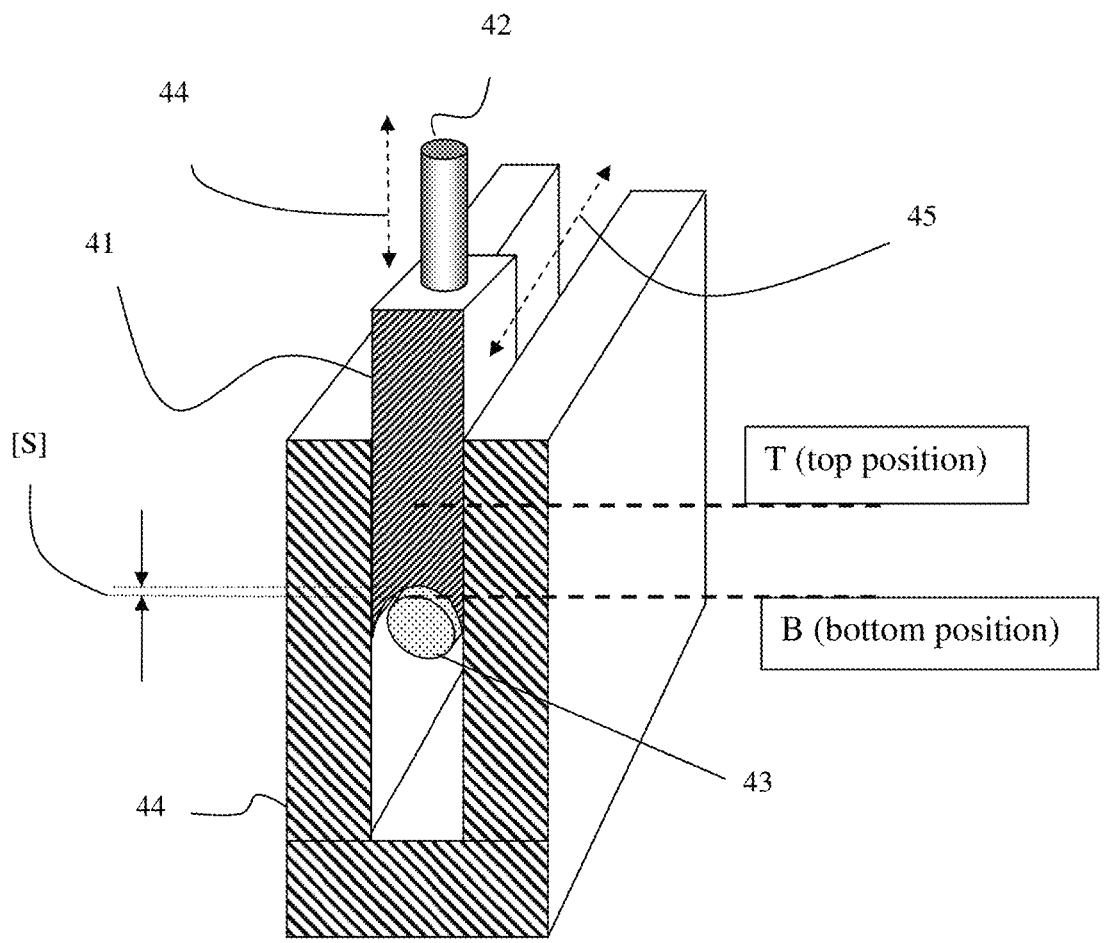
FIG. 4 depicts Prior Art: a perspective view of relevant dimensions and parameters of the operation of a vertically adjustable RF probe (slug).
Figure 5:
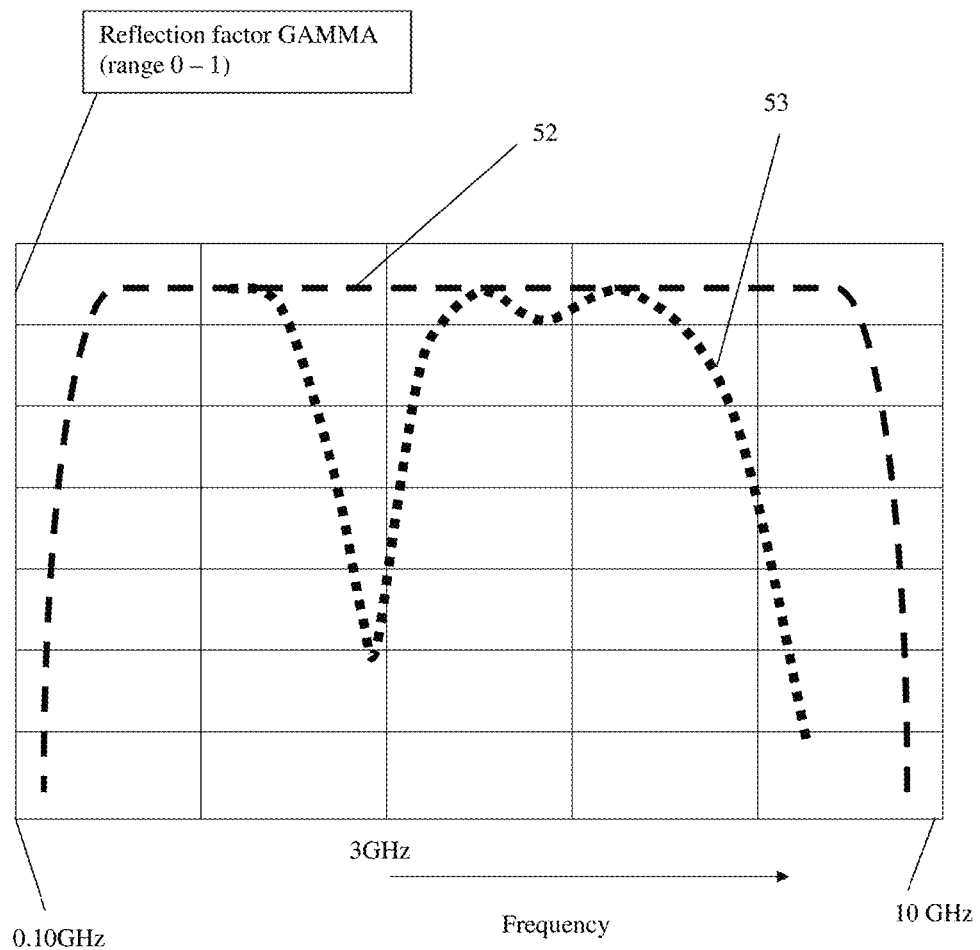
FIG. 5 depicts prior art: reflection factor (VSWR) of a single slug tuner at maximum proximity to the center conductor as a function of frequency.
Figure 6:
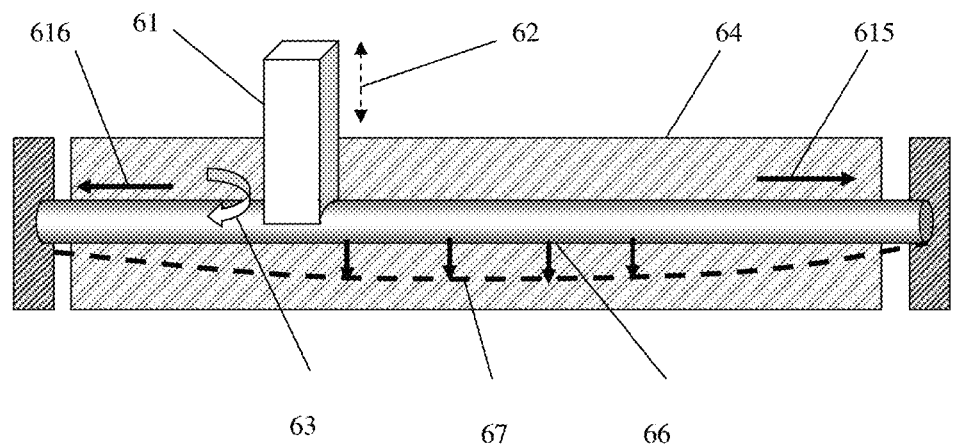
FIGS. 6 a) and 6 b) depict.
Figure 6:
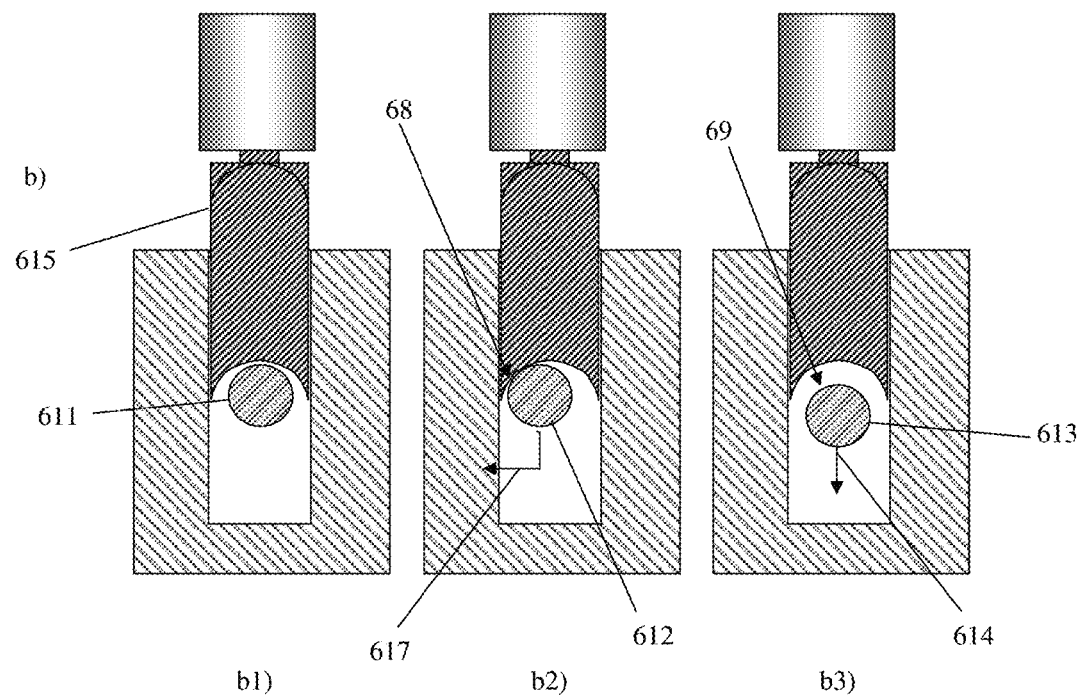
Figure 7:
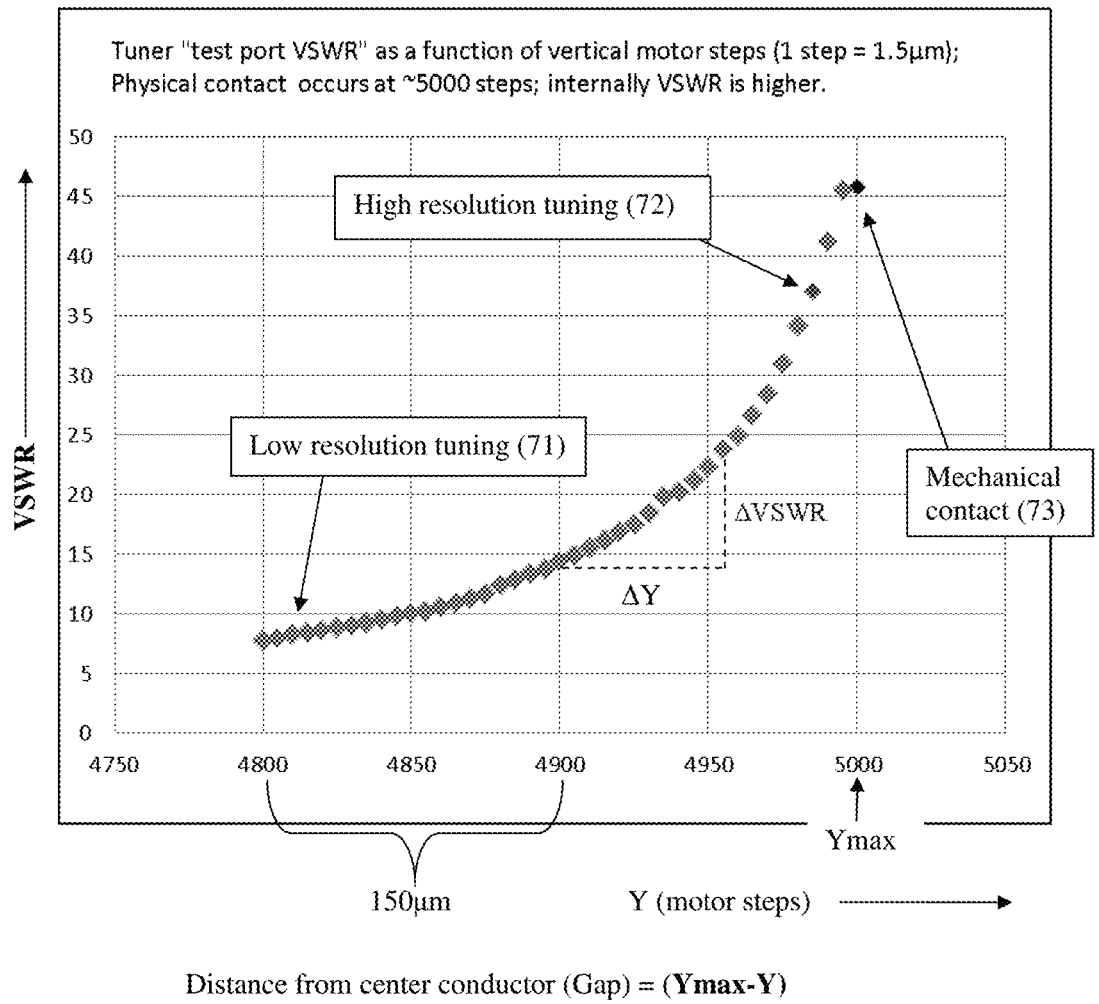
FIG. 7 depicts prior art: the measured dependence of tuner VSWR as a function of the proximity of the tuning probe to the center conductor.
Figure 8:
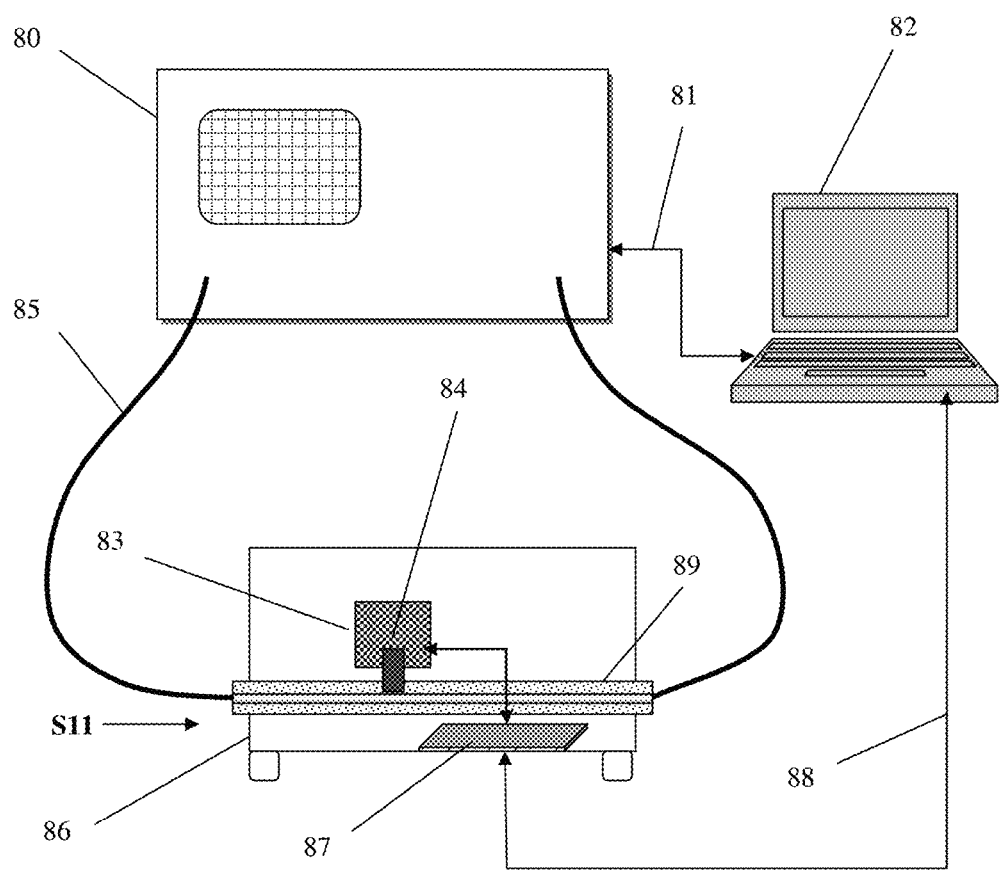
FIG. 8 depicts prior art: the test setup used to calibrate an automatic impedance tuner.

The automated version of the tuner is calibrated using a network analyzer (80, VNA) and a control computer (82); the tuner is connected using RF cables (85) to the VNA ports and using digital cables (88) to the computer (82); the computer controls also the VNA using different digital cables and communication protocol (81); the probes (84) are positioned horizontally and vertically inside the slabline (89) in order to generate desired reflection factors within the tuning range of said tuner (FIG. 8); the collected s-parameter data from the VNA are saved in tuner calibration files. This generic tuner calibration method is used in the specific field.

Obvious alternative embodiments to the herein disclosed method of controlling the thermal expansion of the center conductor of slide screw impedance tuners are imaginable and possible but shall not impede on to the validity of the basic idea of the present invention of joining two separate sections of the center conductor in a manner allowing the center conductor to expand in a controlled manner.

What I claim as my invention is:

1. A temperature stable slide screw impedance tuner comprising
   a test port and an idle port and a slotted airline (slabline) between the ports, having a center conductor and two grounded conductive sidewalls;
   and one or more mobile carriages movable horizontally, parallel to the center conductor of the slabline;
   each said carriage carrying one or more reflective (tuning) probes which are insertable perpendicularly into the slot of the slabline;
   whereby the center conductor comprises two distinct cylindrical pieces (rods 1 and 2) joined together axially by a concentric link, allowing the two pieces to expand and contract longitudinally.

2. A tuner as in claim 1, whereby said mobile carriages and probes are remotely controlled using electrical (stepper) motors, appropriate gear and control electronics and firmware.

3. A tuner as in claim 1, whereby the diameter of the center conductor rods are selected to create characteristic impedance Zo of the slabline.

4. A tuner as in claim 3, whereby Zo is 50 Ohms.

5. A tuner as in claim 3, whereby the link comprises a concentric axial hole in rod 1, and a concentric pin protruding from the opposite rod 2 which slide-fits into the hole of rod 1, hereby establishing reliable electrical sliding contact between the rods.

6. A tuner as in claim 3, whereby the link comprises a metallic ring slide-fitting over both rods whereby the ring is establishing reliable electrical sliding contact between the rods.

7. A tuner as in claim 3, whereby the link comprises concentric axial protrusions of both rods, facing each other, and a metallic ring slide fitting over both protrusions and having the same external diameter as the rods hereby establishing reliable electrical sliding contact between the rods.

8. A tuner as in claim 5, whereby a metallic ring slide-fitting over both rods whereby the ring is establishing reliable electrical sliding contact between the rods.

9. A tuner as in claim 6, 7 or 8, whereby the ring is axially slotted.

* * * * *